(12) United States Patent
Zhu et al.

(10) Patent No.: US 11,579,345 B2
(45) Date of Patent: Feb. 14, 2023

(54) REFLECTIVE DEVICE AND DISPLAY APPARATUS

(71) Applicant: BOE Technology Group Co., Ltd., Beijing (CN)

(72) Inventors: Ming Zhu, Beijing (CN); Xue Dong, Beijing (CN); Meili Wang, Beijing (CN); Fei Wang, Beijing (CN); Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 609 days.

(21) Appl. No.: 16/618,638

(22) PCT Filed: Dec. 15, 2017

(86) PCT No.: PCT/CN2017/116535
§ 371 (c)(1),
(2) Date: Dec. 2, 2019

(87) PCT Pub. No.: WO2018/223655
PCT Pub. Date: Dec. 13, 2018

(65) Prior Publication Data
US 2020/0183063 A1 Jun. 11, 2020

(30) Foreign Application Priority Data
Jun. 9, 2017 (CN) .......................... 201710434058.0

(51) Int. Cl.
*G02B 5/20* (2006.01)
*H01L 31/0232* (2014.01)
*G02F 1/21* (2006.01)
*G02F 1/35* (2006.01)
*G02F 2/00* (2006.01)

(52) U.S. Cl.
CPC ........ *G02B 5/201* (2013.01); *H01L 31/02322* (2013.01); *G02F 1/213* (2021.01); *G02F 1/353* (2013.01); *G02F 2/00* (2013.01); *G02F 2201/08* (2013.01); *G02F 2201/38* (2013.01)

(58) Field of Classification Search
None
See application file for complete search history.

(56) References Cited

U.S. PATENT DOCUMENTS

| 9,019,595 B2 | 4/2015 | Jain |
| 9,354,366 B2 | 5/2016 | Jain |
| 10,103,207 B2 | 10/2018 | Wang et al. |

(Continued)

FOREIGN PATENT DOCUMENTS

| CN | 103620894 A | 3/2014 |
| CN | 104466026 A | 3/2015 |

(Continued)

*Primary Examiner* — Ashok Patel
(74) *Attorney, Agent, or Firm* — Westman, Champlin & Koehler, P.A.

(57) ABSTRACT

The present disclosure relates to a reflective device and a display apparatus. In one embodiment, a reflective device includes: a resonant cavity configured to reflect a light of a first wavelength range; and a light conversion structure disposed within the resonant cavity and configured to convert an incident light of a second wavelength range into the light of the first wavelength range.

20 Claims, 3 Drawing Sheets

(56) References Cited

U.S. PATENT DOCUMENTS

| | | | |
|---|---|---|---|
| 2009/0212696 A1* | 8/2009 | Terao | ............... H01L 51/5265 313/506 |
| 2009/0323751 A1 | 12/2009 | Ji et al. | |
| 2014/0055845 A1 | 2/2014 | Jain | |
| 2015/0177510 A1 | 6/2015 | Nozawa | |
| 2015/0192714 A1 | 7/2015 | Jain | |
| 2018/0138243 A1 | 5/2018 | Wang et al. | |

FOREIGN PATENT DOCUMENTS

| | | |
|---|---|---|
| CN | 106409876 A | 2/2017 |
| CN | 206757181 U | 12/2017 |

* cited by examiner

REFLECTIVE DEVICE AND DISPLAY APPARATUS

CROSS-REFERENCE TO RELATED APPLICATION

This application is a Section 371 National Stage application of International Application No. PCT/CN2017/116535, filed on 15 Dec. 2017, which published as WO 2018/223655 A1 on 13 Dec. 2018, and claims priority to Chinese Patent Application No. 201710434058.0 filed on Jun. 9, 2017 in the State Intellectual Property Office of China, the disclosures of which are hereby incorporated by reference in their entireties.

TECHNICAL FIELD

Embodiments of the present disclosure relate to the field of display technology, and particularly, to a reflective device and a display apparatus.

BACKGROUND

In the field of display technology, some reflective display devices utilize a Fabry-Perot resonant cavity structure to achieve light reflection.

SUMMARY

According to embodiments of the present disclosure, there is provided a reflective device, including: a resonant cavity configured to reflect a light of a first wavelength range; and a light conversion structure disposed within the resonant cavity and configured to convert an incident light of a second wavelength range into the light of the first wavelength range, that is, to convert an incident light with a wavelength out of the first wavelength range into the light of the set wavelength range, the second wavelength range being different from the first wavelength range. Here, the first wavelength range may be a preset wavelength range, and the second wavelength range is out of the preset wavelength range.

In some embodiments, in the reflective device, the resonant cavity comprises: a cavity body, a light absorbing layer disposed on a side of the cavity body, and a reflective mirror disposed on a side of the cavity body away from the light absorbing layer; an optical path matching the light of the first wavelength range is defined between the light absorbing layer and the reflective mirror, a medium is filled in the optical path, and the light conversion structure is disposed between the light absorbing layer and the reflective mirror.

In some embodiments, in the reflective device, the light conversion structure has a thickness which satisfies the following relationship: $N=(L/2)/R$, in which N is the thickness of the light conversion structure, L is a central wavelength in the first wavelength range, and R is a material refractive index of the light conversion structure.

In some embodiments, in the reflective device, the light of the first wavelength range comprises a first band light within a visible light band, the light conversion structure comprises a down-conversion material configured to convert a second band light and a third band light within the visible light band into the first band light, wherein a band of the first band light is lower than a band of the second band light and a band of the third band light, the band of the second band light is between the band of the first band light and the band of the third band light, and the band of the third band light is higher than the band of the first band light and the band of the second band light.

In some embodiments, in the reflective device, the light of the first wavelength range comprises a third band light within a visible light band, the light conversion structure comprises an up-conversion material configured to convert a first band light and a second band light within the visible light band into the third band light, wherein a band of the first band light is lower than a band of the second band light and a band of the third band light, the band of the second band light is between the band of the first band light and the band of the third band light, and the band of the third band light is higher than the band of the first band light and the band of the second band light.

In some embodiments, in the reflective device, the light of the first wavelength range comprises a second band light within a visible light band, the light conversion structure comprises an up-conversion material configured to convert a first band light within the visible light band into the second band light, and/or a down-conversion material configured to convert a third band light within the visible light band into the second band light, wherein a band of the first band light is lower than a band of the second band light and a band of the third band light, the band of the second band light is between the band of the first band light and the band of the third band light, and the band of the third band light is higher than the band of the first band light and the band of the second band light.

In some embodiments, in the reflective device, the up-conversion material comprises inorganic compound doped with rare earth ions.

In some embodiments, in the reflective device, the up-conversion material comprises inorganic compound doped with rare earth ions.

In some embodiments, in the reflective device, the light of the first wavelength range comprises a light that covers only a band range of a single color within a visible light range.

In some embodiments, in the reflective device, the light of the first wavelength range comprises a light within an infrared band range.

In some embodiments, in the reflective device, the resonant cavity further comprises: an anti-reflection film disposed on a surface of the light absorbing layer facing towards a light exit side of the reflective device.

In some embodiments, in the reflective device, the medium comprises at least one of air, inorganic film and organic film.

In some embodiments, in the reflective device, the medium comprises air; the light conversion structure is disposed on a surface of the light absorbing layer facing towards the reflective mirror, or the light conversion structure is disposed on a surface of the reflective mirror facing towards the light absorbing layer.

In some embodiments, in the reflective device, the medium further comprises at least one of inorganic film layers and/or at least one of organic film layers, and the light conversion structure is disposed between any two layers, located between the light absorbing layer and the reflective mirror, of the at least one of inorganic film layers and/or the at least one of organic film layers.

In some embodiments, in the reflective device, the inorganic compound comprises at least one of a fluoride, an oxide, a sulfur compound, an oxyfluoride, or a halide.

In another aspect, according to embodiments of the present disclosure, there is also provided a display apparatus comprising: a plurality of pixel units each comprising a plurality of the reflective devices according to any one of the abovementioned embodiments of the present disclosure, wherein, the reflective devices belonging to the same pixel unit have different light reflection wavelength ranges.

In some embodiments, in the display apparatus, each pixel unit comprise a red subpixel unit, a green subpixel unit and a blue subpixel unit, and the reflective devices for the red subpixel unit, the green subpixel unit and the blue subpixel unit have different light reflection wavelength ranges, respectively.

In some embodiments, in the display apparatus, the light of the first wavelength range of the reflective device for the red subpixel unit is a first band light within a visible light band, the light conversion structure comprises a down-conversion material configured to convert a second band light and a third band light within the visible light band into the first band light, wherein a band of the first band light is lower than a band of the second band light and a band of the third band light, the band of the second band light is between the band of the first band light and the band of the third band light, and the band of the third band light is higher than the band of the first band light and the band of the second band light.

In some embodiments, in the display apparatus, the light of the first wavelength range of the reflective device for the blue subpixel unit is a third band light within a visible light band, the light conversion structure comprises an up-conversion material configured to convert a first band light and a second band light within the visible light band into the third band light, wherein a band of the first band light is lower than a band of the second band light and a band of the third band light, the band of the second band light is between the band of the first band light and the band of the third band light, and the band of the third band light is higher than the band of the first band light and the band of the second band light.

In some embodiments, in the display apparatus, the light of the first wavelength range of the reflective device for the green subpixel unit is a second band light within a visible light band, the light conversion structure comprises an up-conversion material configured to convert a first band light within the visible light band into the second band light, and/or a down-conversion material configured to convert a third band light within the visible light band into the second band light, wherein a band of the first band light is lower than a band of the second band light and a band of the third band light, the band of the second band light is between the band of the first band light and the band of the third band light, and the band of the third band light is higher than the band of the first band light and the band of the second band light.

DETAILED DESCRIPTION OF THE EMBODIMENTS

Figure 1:
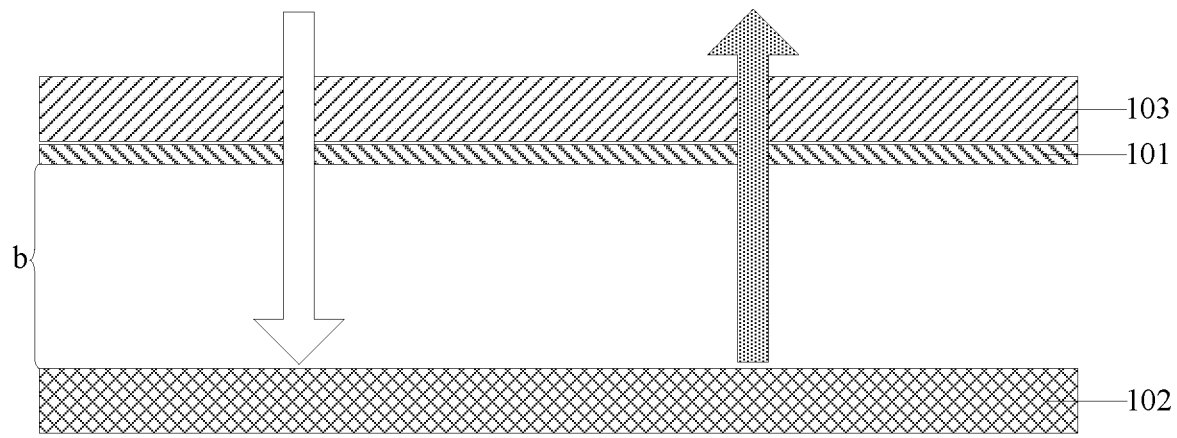
FIG. 1 is a schematic view showing a structure of a reflective device.

Specific embodiments of the reflective device and the display apparatus according to embodiments of the present disclosure will be described in detail below with reference to the accompanying drawings.

Shapes and sizes of the various components in the drawings do not reflect true proportions of the reflective devices, and are merely intended to illustrate the present disclosure. Here, wide line arrow in the drawing indicates direction of a light.

In related art, a reflective device uses the Fabry-Perot resonant cavity shown in FIG. 1 to achieve reflection. The reflective device includes an anti-reflection layer 103, a thin metallic light absorbing layer 101 and a reflective mirror 102. By adjusting the optical path b in the cavity body, it can be realized that light of a specific wavelength in an incident light is reflected while lights of the other wavelengths in the incident light are repeatedly oscillated in the cavity body and are absorbed by the thin metallic light absorbing layer 101 and are eventually exhausted in energy. In practice, this reflective device has low light utilization.

Figure 2:
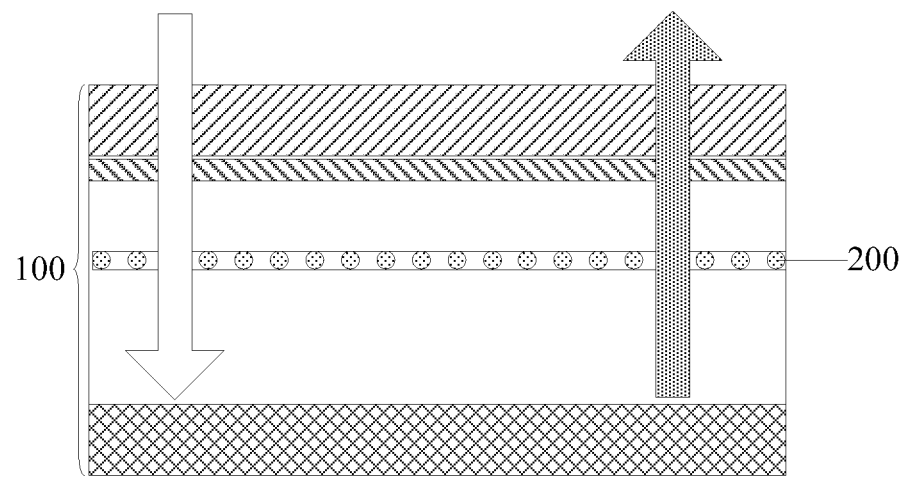
FIG. 2 is a schematic view showing a structure of a reflective device according to some embodiments of the present disclosure.

According to embodiments of the present disclosure, there is provided a reflective device. Referring to FIG. 2, it includes: a resonant cavity 100 configured to reflect a light of a first wavelength range; and a light conversion structure 200 disposed within the resonant cavity 100 and configured to convert an incident light of a second wavelength range into the light of the first wavelength range.

In specific implementations, in the reflective device according to some embodiments of the present disclosure, the resonant cavity 100 can adopt a variety of implementation structures, such as Fabry-Perot resonant cavity.

Figure 3A:
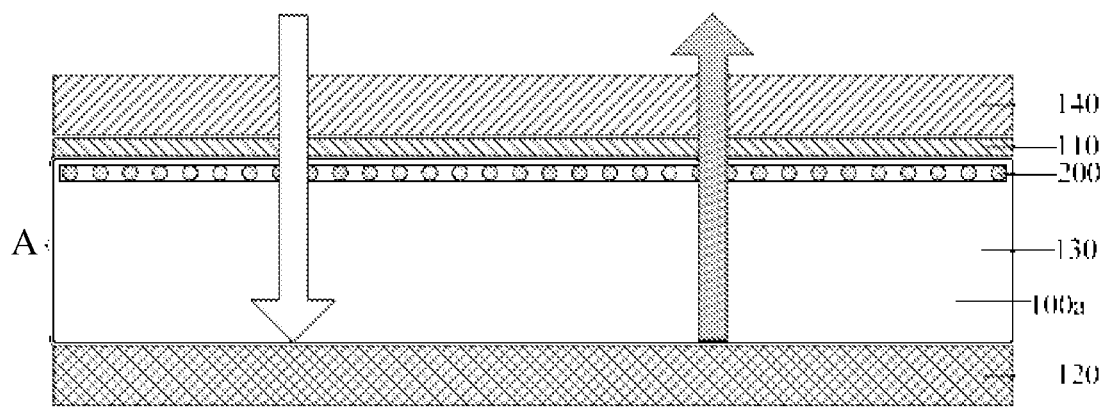
FIG. 3a and FIG. 3b are schematic views showing specific structures of a reflective device according to embodiments of the present disclosure, respectively.
Figure 3B:
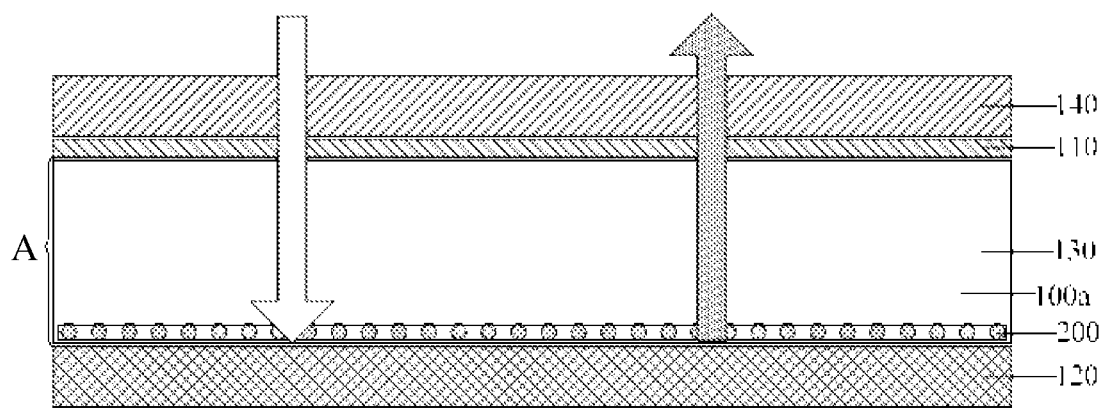

Specifically, in the reflective device according to embodiments of the present disclosure, no matter what structure of the resonant cavity 100, referring to FIG. 3a and FIG. 3b, the resonant cavity 100 generally includes: a cavity body 100a, a light absorbing layer 110 disposed on a side of the cavity body 100a, and a reflective mirror 120 disposed on a side of the cavity body 100a away from the light absorbing layer 110; an optical path A matching the light of the first wavelength range is defined between the light absorbing layer 110 and the reflective mirror 120, the light conversion structure 200 is disposed between the light absorbing layer 110 and the reflective mirror 120, and a medium 130 is filled in the optical path A. That is to say, the light conversion structure 200 is disposed in the medium 130.

Figure 5:
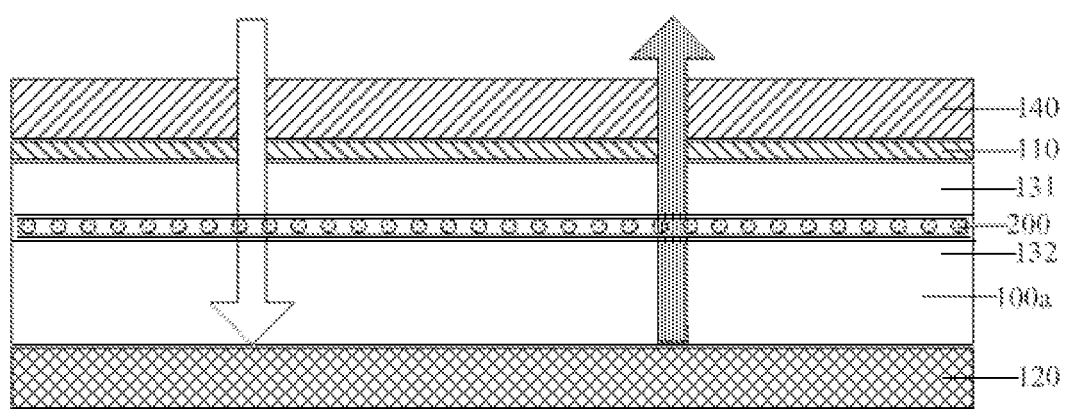
FIG. 5 is a schematic view showing a structure of a reflective device according to some embodiments of the present disclosure, in which an inorganic film layer and an organic film layer, as the medium, and the light conversion structure are provided in the cavity body.

Specifically, in the reflective device according to embodiments of the present disclosure, the medium 130 filled in the optical path A may include one or any combination(s) of air, inorganic film(s), and organic film(s). For example, it is possible to fill only air as the medium 130, or it is also possible to fill partly the inorganic film(s) and partly the air as the medium 130, which is not limited herein. In case that only air is used as the medium 130, in order to facilitate the fabrication of the reflective device, in specific implementations, as shown in FIG. 3a, the light conversion structure 200 may be disposed on the surface of the light absorbing layer 110 facing towards the reflective mirror 120; or else, as shown in FIG. 3b, the light conversion structure 200 is disposed on the surface of the reflective mirror 120 facing towards the light absorbing layer 110, which is not limited herein. In case that the inorganic film(s) and/or the organic film(s) are/is used partly or wholly as the medium 130, in specific implementations, the light conversion structure 200 may be disposed between any two layers, located between the light absorbing layer 110 and the reflective mirror 120, of at least one of inorganic film layers and/or at least one of organic film layers, according to production requirements, which is no limited herein. For example, in the embodiment of FIG. 5, the light conversion structure 200 is disposed between one inorganic film layer 131 and one organic film layer 132 within the cavity body 100a, and the inorganic film layer 131 and the organic film layer 132 together serve as the medium. In addition, the light absorbing layer 110 may have a thin metallic layer structure.

Specifically, in the reflective device according to embodiments of the present disclosure, size of the optical path A between the light absorbing layer 110 and the reflective mirror 120 is related to the first wavelength range of the light of the first wavelength range, and the material and thickness of the medium 130. In particular, the relationship between them is: $a=(n_1*d_1+n_2*d_2\ldots)*L/2$, in which, $d_1, d_2 \ldots$ are the thicknesses of layers of the mediums 130; $n_1, n_2 \ldots$ are material refractive indexes of the mediums 130, and L is the central wavelength of the first wavelength range.

Moreover, specifically, in the reflective device according to embodiments of the present disclosure, thickness of the light conversion structure 200 is related to the first wavelength range of the light of the first wavelength range and the material of the light conversion structure. In particular, the relationship between them is: $N=(L/2)/R$, in which, N is the thickness of the light conversion structure, L is the central wavelength of the first wavelength range, and R is the material refractive index of the light conversion structure 200.

In specific implementations, in the reflective device according to some embodiments of the present disclosure, in order to improve the light reflection efficiency at the light absorbing layer 110, referring to FIG. 3a and FIG. 3b, the resonant cavity 100 may further include: an anti-reflection film 140 disposed on a surface of the light absorbing layer 110 facing towards a light exit side of the reflective device, to increase the proportion of incident light entering the optical path A between the light absorbing layer 110 and the reflective mirror 120 while decreasing the proportion of the incident light that is directly reflected by the surface of the light absorbing layer 110 facing towards the light exit side of the reflective device, thereby increasing the utilization of the incident light and thus improving light reflectivity.

In specific implementations, the light of first wavelength range that the reflective device according to embodiments of the present disclosure can reflect is generally within the visible light range. Moreover, the wavelength range that the reflective device reflects covers only a band range of single color, so that the reflective device can be used as a monochromatic light emitter for display or illumination. The light of first wavelength range can also be in the infrared band range so that the reflective device can be applied to the sensor. Of course, in specific implementations, according to the actual needs, it can also be set that the wavelength range of reflection of the reflective device covers band ranges of multiple colors, which is not limited herein.

Moreover, in specific implementations, in the reflective device according to some embodiments of the present disclosure, in order to enable the light conversion structure 200 to convert the incident light of second wavelength range into a light of first wavelength range so as to improve light utilization, the material selected for the light conversion structure 200 is related to the first wavelength range of the reflected light. In the following, the wavelength range of the light reflected by the reflective device covering only the band range of a single color is taken as an example to describe the specific material selection of the light conversion structure 200.

In specific implementations, in the reflective device according to some embodiments of the present disclosure, when the light of first wavelength range that needs to be reflected by the reflective device is the first band light within the visible light band, the light conversion structure 200 generally includes a down-conversion material for converting the third band light and the second band light within the visible light band into the first band light. Specifically, the down-conversion material may include one or a combination of an inorganic luminescent material and an organic luminescent material, and may be, for example, a quantum dot material, a fluorescent material, or the like. The organic luminescent material may be an organic small molecule luminescent material or an organic high molecular polymer luminescent material, which is not limited herein. Moreover, when a plurality of down-conversion materials are selected as the light conversion structure 200, these materials may be disposed in film layers and these film layers may be adjacent or spaced, or these materials may be mixed in the same film layer, which is not limited herein.

According to embodiments of the present disclosure, a band of the first band light is lower than a band of the second band light and a band of the third band light, the band of the second band light is between the band of the first band light and the band of the third band light, and the band of the third band light is higher than the band of the first band light and the band of the second band light. For example, the first band light is red light, the second band light is green light, and the third band light is blue light.

For example, when the reflective device needs to reflect red light, the material of the light conversion structure 200 is a down-conversion material for converting blue light and green light into red light. Specifically, the down-conversion material may select a red luminescent material such as a red quantum dot or a red fluorescent material, which is not limited herein.

In specific implementations, in the reflective device according to some embodiments of the present disclosure, when the light of first wavelength range that needs to be reflected by the reflective device is the third band light within the visible light band, the light conversion structure 200 generally includes an up-conversion material for converting the first band light and the second band light within the visible light band into the third band light. Specifically, the up-conversion material may include inorganic compound doped with rare earth ions. For example, depending on the third band light to be converted, one or more rare earth ions of respective concentrations and ratios may be doped in an inorganic compound such as a fluoride, an oxide, a sulfur compound, an oxyfluoride, or a halide. For example, NaYF4, which has the highest up-conversion luminescence efficiency currently, can be selected as the host material, and is doped with Yb, Tm and Er, wherein the doping ratio can be Yb:Tm:Er=18~60:0~0.2:0~2. Moreover, when a plurality of up-conversion materials are selected as the light conversion structure 200, these materials may be disposed in film layers and these film layers may be adjacent or spaced, or these materials may be mixed in the same film layer, which is not limited herein.

For example, when the reflective device needs to reflect blue light, the material of the light conversion structure 200 is an up-conversion material for converting red light and green light into blue light. Specifically, the up-conversion material may select NaYF4, as the host material, doped with Yb, Tm and Er, wherein the doping ratio is Yb:Tm:Er=20: 0.2:0~0.5.

In specific implementations, in the reflective device according to some embodiments of the present disclosure, when the light of first wavelength range that needs to be reflected by the reflective device is the second band light within the visible light band, the light conversion structure 200 generally includes: an up-conversion material for converting the first band light within the visible light band into the second band light, and/or a down-conversion material for converting the third band light within the visible light band into the second band light. Moreover, in order to maximize the light utilization, in the specific implementation, the light conversion structure 200 includes both an up-conversion material and a down-conversion material. Specifically, the down-conversion material may include one or a combination of an inorganic luminescent material and an organic luminescent material, and may be, for example, a quantum dot material, a fluorescent material, or the like. The organic luminescent material may be an organic small molecule luminescent material or an organic high molecular polymer luminescent material, which is not limited herein. Specifically, the up-conversion material may include inorganic compound doped with rare earth ions. For example, depending on the third band light to be converted, one or more rare earth ions of respective concentrations and ratios may be doped in an inorganic compound such as a fluoride, an oxide, a sulfur compound, an oxyfluoride, or a halide. For example, NaYF4, which has the highest up-conversion luminescence efficiency currently, can be selected as the host material, and is doped with Yb, Tm and Er, wherein the doping ratio can be Yb:Tm:Er=18~60:0~0.2:0~2. Moreover, when a plurality of up-conversion materials are selected as the light conversion structure 200, these materials may be disposed in film layers and these film layers may be adjacent or spaced, or these materials may be mixed in the same film layer, which is not limited herein.

For example, when the reflective device needs to reflect green light, the material of the light conversion structure 200 may include both an up-conversion material for converting red light into green light and a down-conversion material for converting blue light into green light. Specifically, the down-conversion material may select a green organic luminescent material such as a green quantum dot or a green fluorescent material, which is not limited herein. Specifically, the up-conversion material may select NaYF4, as the host material, doped with Yb, Tm and Er, wherein the doping ratio is Yb:Tm:Er=18~25:0:2.

In the reflective device according to the embodiments of the present disclosure, since the light conversion structure 200 disposed in the resonant cavity 100 is added, the light conversion structure 200 can improve the utilization of incident light, and effectively utilize the light of second wavelength range, other than the light of first wavelength range, that is not reflected by the resonant cavity 100 and is repeatedly oscillated and absorbed in the resonant cavity 100 to convert the incident light of second wavelength range into the light of first wavelength range, thereby increasing the proportion of the light reflected by the reflective device to improve the reflective efficiency of the reflective device.

Based on the same inventive concept, according to embodiments of the present disclosure, there is further provided a display apparatus. The display apparatus can be any product or component having a display function, such as a mobile phone, a tablet computer, a television, a display, a notebook computer, a digital photo frame, a navigator, and the like. Implementations of the display apparatus may refer to the abovementioned embodiments of the reflective device, and the repeated description is omitted.

Figure 4:
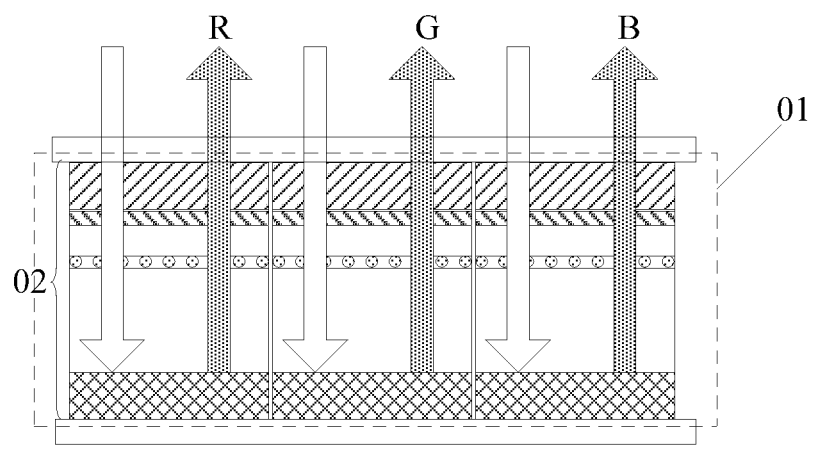
FIG. 4 is a schematic view showing a structure of a display apparatus according to some embodiments of the present disclosure.

Specifically, the display apparatus according to embodiments of the present disclosure, as shown in FIG. 4, includes a plurality of pixel units 01. Each pixel unit 01 includes a plurality of the abovementioned reflective devices 02 according to embodiments of the present disclosure, as sub-pixel units. The reflective devices 02 belonging to the same pixel unit 01 have different light reflection wavelength ranges. For example, as shown in FIG. 4, a reflective device for reflection of red light R, a reflective device for reflection of green light G, and a reflective device for reflection of blue light B may be selected to constitute one pixel unit. In particular, each pixel unit includes a red subpixel unit, a green subpixel unit and a blue subpixel unit, and the reflective devices for the red subpixel unit, the green subpixel unit and the blue subpixel unit have different light reflection wavelength ranges, respectively. The light of first wavelength range of the reflective device for the red subpixel unit is a first band light within the visible light band, and the light conversion structure includes a down-conversion material configured to convert a second band light and a third band light within the visible light band into the first band light. The light of the first wavelength range of the reflective device for the blue subpixel unit is a third band light within the visible light band, and the light conversion structure includes an up-conversion material configured to convert the first band light and the second band light within the visible light band into the third band light. The light of the first wavelength range of the reflective device for the green subpixel unit is the second band light within the visible light band, and the light conversion structure includes an up-conversion material configured to convert the first band light within the visible light band into the second band light, and/or a down-conversion material configured to convert the third band light within the visible light band into the second band light. For example, the first band light is red light, the second band light is green light, and the third band light is blue light. Since the abovementioned reflective device according to the embodiments of the present disclosure with high reflection efficiency is used as a sub-pixel in the display apparatus, the ambient light can be better used for reflective display to ensure better reflectivity.

With the abovementioned reflective device and display apparatus according to the embodiments of the present disclosure, since the light conversion structure disposed in the resonant cavity is added, the light conversion structure can improve the utilization of incident light, and effectively utilize the light of second wavelength range, other than the light of first wavelength range, that is not reflected by the resonant cavity and is repeatedly oscillated and absorbed in the resonant cavity to convert the incident light of second wavelength range into the light of first wavelength range, thereby increasing the proportion of the light reflected by the reflective device to improve the reflective efficiency of the reflective device.

It will be apparent to those skilled in the art that various changes and modifications can be made in the present disclosure without departing from the spirit and scope of the present disclosure. Thus, it is intended that the present disclosure covers these changes and modifications if they are within the scope of the appended claims and its equivalents.

What is claimed is:

1. A reflective device, comprising:
   a resonant cavity configured to reflect a light of a first wavelength range; and
   a light conversion structure disposed within the resonant cavity and configured to convert an incident light of a second wavelength range into the light of the first wavelength range, the second wavelength range being different from the first wavelength range.

2. The reflective device of claim 1, wherein, the resonant cavity comprises:
   a cavity body,
   a light absorbing layer disposed on a side of the cavity body, and
   a reflective mirror disposed on a side of the cavity body away from the light absorbing layer;
   an optical path matching the light of the first wavelength range is defined between the light absorbing layer and the reflective mirror, a medium is filled in the optical path, and the light conversion structure is disposed between the light absorbing layer and the reflective mirror.

3. The reflective device of claim 1, wherein, the light conversion structure has a thickness which satisfies the following relationship:
   $N=(L/2)/R$, in which N is the thickness of the light conversion structure, L is a central wavelength in the first wavelength range, and R is a material refractive index of the light conversion structure.

4. The reflective device of claim 3, wherein, the light of the first wavelength range comprises a first band light within a visible light band, the light conversion structure comprises a down-conversion material configured to convert a second band light and a third band light within the visible light band into the first band light, wherein a band of the first band light is lower than a band of the second band light and a band of the third band light, the band of the second band light is between the band of the first band light and the band of the third band light, and the band of the third band light is higher than the band of the first band light and the band of the second band light.

5. The reflective device of claim 3, wherein, the light of the first wavelength range comprises a third band light within a visible light band, the light conversion structure comprises an up-conversion material configured to convert a first band light and a second band light within the visible light band into the third band light, wherein a band of the first band light is lower than a band of the second band light and a band of the third band light, the band of the second band light is between the band of the first band light and the band of the third band light, and the band of the third band light is higher than the band of the first band light and the band of the second band light.

6. The reflective device of claim 3, wherein, the light of the first wavelength range comprises a second band light within a visible light band, the light conversion structure comprises at least one of an up-conversion material configured to convert a first band light within the visible light band into the second band light, or a down-conversion material configured to convert a third band light within the visible light band into the second band light, wherein a band of the first band light is lower than a band of the second band light and a band of the third band light, the band of the second band light is between the band of the first band light and the band of the third band light, and the band of the third band light is higher than the band of the first band light and the band of the second band light.

7. The reflective device of claim 5, wherein, the up-conversion material comprises inorganic compound doped with rare earth ions.

8. The reflective device of claim 6, wherein, the up-conversion material comprises inorganic compound doped with rare earth ions.

9. The reflective device of claim 1, wherein, the light of the first wavelength range comprises a light that covers only a band range of a single color within a visible light range.

10. The reflective device of claim 1, wherein, the light of the first wavelength range comprises a light within an infrared band range.

11. The reflective device of claim 2, wherein, the resonant cavity further comprises:
    an anti-reflection film disposed on a surface of the light absorbing layer facing towards a light exit side of the reflective device.

12. The reflective device of claim 2, wherein, the medium comprises at least one of air, inorganic film and organic film.

13. The reflective device of claim 12, wherein, the medium comprises air;
    the light conversion structure is disposed on a surface of the light absorbing layer facing towards the reflective mirror, or the light conversion structure is disposed on a surface of the reflective mirror facing towards the light absorbing layer.

14. The reflective device of claim 13, wherein, the medium further comprises at least one of at least one inorganic film layers or at least one organic film layers, and the light conversion structure is disposed between any two layers located between the light absorbing layer and the reflective mirror, of the at least one of the at least one inorganic film layers or the at least one organic film layers.

15. The reflective device of claim 8, wherein, the inorganic compound comprises at least one of a fluoride, an oxide, a sulfur compound, an oxyfluoride, or a halide.

16. A display apparatus, comprising:
    a plurality of pixel units each comprising a plurality of the reflective devices according to claim 1, wherein, the reflective devices belonging to the same pixel unit have different light reflection wavelength ranges.

17. The display apparatus of claim 16, wherein, each pixel unit comprise a red subpixel unit, a green subpixel unit and a blue subpixel unit, and the reflective devices for the red subpixel unit, the green subpixel unit and the blue subpixel unit have different light reflection wavelength ranges, respectively.

18. The display apparatus of claim 17, wherein, the light of the first wavelength range of the reflective device for the red subpixel unit is a first band light within a visible light band, the light conversion structure comprises a down-conversion material configured to convert a second band light and a third band light within the visible light band into the first band light, wherein a band of the first band light is lower than a band of the second band light and a band of the third band light, the band of the second band light is between the band of the first band light and the band of the third band light, and the band of the third band light is higher than the band of the first band light and the band of the second band light.

19. The display apparatus of claim 17, wherein, the light of the first wavelength range of the reflective device for the blue subpixel unit is a third band light within a visible light band, the light conversion structure comprises an up-conversion material configured to convert a first band light and a second band light within the visible light band into the third band light, wherein a band of the first band light is lower than a band of the second band light and a band of the third band light, the band of the second band light is between the band of the first band light and the band of the third band light, and the band of the third band light is higher than the band of the first band light and the band of the second band light.

20. The display apparatus of claim 17, wherein, the light of the first wavelength range of the reflective device for the green subpixel unit is a second band light within a visible light band, the light conversion structure comprises at least one of an up-conversion material configured to convert a first band light within the visible light band into the second band light, or a down-conversion material configured to convert a third band light within the visible light band into the second band light, wherein a band of the first band light is lower than a band of the second band light and a band of the third band light, the band of the second band light is between the band of the first band light and the band of the third band light, and the band of the third band light is higher than the band of the first band light and the band of the second band light.

* * * * *